United States Patent
Toyofuku

(10) Patent No.: US 6,392,279 B1
(45) Date of Patent: *May 21, 2002

(54) SEMICONDUCTOR DEVICE HAVING LDD STRUCTURE ADAPTED TO LOWER PARASITIC CAPACITANCE AND PARASITIC RESISTANCE

(75) Inventor: Tsuyoshi Toyofuku, Kanagawa (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/968,004

(22) Filed: Nov. 12, 1997

(30) Foreign Application Priority Data

Jun. 11, 1997 (JP) .............................................. 9-153979

(51) Int. Cl.$^7$ .......................... H01L 29/76; H01L 29/94

(52) U.S. Cl. ...................... 257/408; 257/344; 257/401

(58) Field of Search ................................ 257/408, 401, 257/328, 331, 335, 341, 392, 344; 438/283, 284, 286, 279

(56) References Cited

U.S. PATENT DOCUMENTS

| | | | | |
|---|---|---|---|---|
| 4,419,809 A | * | 12/1983 | Riseman et al. | 438/231 |
| 5,528,058 A | * | 6/1996 | Pike, Jr. et al. | 257/401 |
| 5,547,888 A | * | 8/1996 | Yamazaki | 438/279 |
| 5,580,804 A | * | 12/1996 | Joh | 438/231 |
| 5,753,942 A | * | 5/1998 | Seok | 257/401 |

FOREIGN PATENT DOCUMENTS

| | | |
|---|---|---|
| JP | 3-112165 | 5/1991 |
| JP | 6-232407 | * 8/1994 |
| JP | 7-263677 | 10/1995 |

* cited by examiner

*Primary Examiner*—Steven Loke
*Assistant Examiner*—Hung Kim Vu
(74) *Attorney, Agent, or Firm*—Armstrong, Westerman & Hattori, LLP

(57) ABSTRACT

The MOS transistor incorporated in a semiconductor device comprises a gate electrode formed on a semiconductor substrate through the medium of a gate insulating film, a first impurity introduced area of an LDD structure composed of a low-concentration impurity area and a high-concentration impurity area formed on the semiconductor substrate on one side of the gate electrode, and a second impurity introduced area composed solely of a high-concentration impurity area formed on the semiconductor substrate on the other side of the gate electrode.

2 Claims, 9 Drawing Sheets

SEMICONDUCTOR DEVICE HAVING LDD STRUCTURE ADAPTED TO LOWER PARASITIC CAPACITANCE AND PARASITIC RESISTANCE

BACKGROUND OF THE INVENTION

1. Field of the Invention

This invention relates to a semiconductor device and a method for the production thereof and more particularly to a semiconductor device incorporating therein a MOS transistor and a method for the production thereof.

2. Description of the Prior Art

In recent years, the advance of the information industry has reached the point where the information processing needs further integration and further increase of speed. For the computers to fulfill this need, increases in capacity and in operating speed constitute themselves essential requirements. For the purpose of realizing in the computers these increases in capacity and operating speed, the computers are in need of such LSI's as are capable of high-speed operation and high integration and also such transistor elements as are extremely minute in size and highly prominent in quality.

For the sake of vesting the LSI's with high-speed operation and high integration, it is the most effective and explicit measure simply to miniaturize the component devices of the circuits. In the existent MOS transistors, the gates are on the verge of contracting to lengths of not more than 0.3 µm. The term "gate length" as used herein means the length of a gate electrode taken in the direction from the source to the drain thereof. This definition holds good in the following description. The length from the source to the drain along the gate length will be referred to herein below as "channel length."

Incidentally, the formation of a gate electrode which determines this gate length is governed by the photolithography and the etching technique and the limit of the contraction of the gate length depends on the limits which are imposed on the resist exposure device, the etching device, and the like. Further, the accuracy required in positioning the gate electrodes for exposure and the allowance for the margin relative to the finishing width of the gate electrodes are other problems. In the circumstances, the promotion of stable quantity production of MOS transistors calls for maturity of the pertinent technique and the immediate start of the quantity production is difficult to attain.

As a means to decrease the gate length, JP-A-07-263,677 discloses a technique which comprises the steps of forming an oxide film pattern, growing a doped polysilicon film on the entire substrate, then allowing the doped polysilicon film to remain in a narrow width as a gate electrode on the lateral part of the oxide film, and subsequently removing the oxide film pattern. In this case, during the removal of the oxide film, the insulating film formed of the same substance as the oxide film and intended to separate the adjacent elements is simultaneously etched. The contraction of the element-separating insulating film, therefore, renders appropriate separation of the adjacent elements no longer feasible.

If the miniaturization of elements thus contemplated is realized, it will still entail other problems. In spite of the miniaturization of devices, the producers of such devices tend to adhere to the conventional standard value of 5 V as the power source voltage for the circuits in consideration of such factors as the generalization of elements and the ensurance of tolerable margin in the S/N ratio on the part of the users of the devices. This fact gives rise to the problem of requiring the devices to be enabled to operate in an exalted electric field. Now, this problem will be described below.

In the MOS transistor, when the gate length or the channel length is contracted without changing the power source voltage, the depletion layer which occurs in the neighborhood of the drain layer grows to reach the source layer and, consequently, lowers the diffusion potential of the source layer and degrades the junction pressure resistance between the source and the drain.

Further, when the drain field begins to manifest its influence in the channel area of the semiconductor layer directly below the gate electrode, the inversion threshold voltage in the channel area of the MOS transistor is no longer easily controlled with the gate voltage, and the threshold voltage ($V_{th}$) of the gate voltage is lowered, and the subthreshold property concerning the device operation below the threshold voltage is deteriorated.

For the purpose of diminishing the depletion layer expanding in the semiconductor substrate under the gate electrode, a method which consists in heightening the concentration of an impurity in the semiconductor substrate directly below the gate electrode and a method which resides in decreasing the thickness of the gate oxide film have been adopted. These methods, however, entail other problems anew.

First, the increase of the concentration of an impurity in the semiconductor substrate results in sharpening the gradient of concentration between the drain diffusion layer and the semiconductor substrate, further expanding the drain field, affecting the drift speed of the migrating carrier itself, attenuating the mobility of the carrier, and lowering the drain current. Further, the energy of a high electric field applied between the drain diffusion layer and the substrate adds to the average energy of the migrating carrier and induces a hot carrier.

Then, the decrease of the thickness of the gate oxide film results in enlarging the effective gate field applied to the gate oxide film itself, exerting a heavy load on the insulation pressure resistance of the gate oxide film, and degrading the resistance of the hot carrier.

It has been heretofore customary to solve these problems by forming a gate electrode 101 of a MOS transistor through the medium of a gate insulating film 103 on a semiconductor substrate 102, then forming a shallow layer 104 having an impurity diffused therein at a low concentration (hereinafter referred to as "low-concentration impurity diffused layer"), and thereafter forming insulating side walls 105 one each on the opposite sides of the gate electrode 101 as illustrated in FIG. 12A and subsequently forming in the semiconductor substrate 102 a deep layer 106 having an impurity diffused at a high concentration while using the gate electrode 101 and the insulating side walls 105 as masks as illustrated in FIG. 12B, whereby the layers 104 and 106 having the impurity diffused at the low and the high concentration constitute themselves a source layer 107 and a drain layer 108 of the LDD (lightly doped drain) structure.

The drain layer 108 of the LDD structure described above diminishes the inclination of the concentration of an impurity in the part, approximating closely to the gate electrode 101, alleviates the drain field concentrated locally in the proximity of the gate electrode 101, and consequently improves the hot carrier resistance.

In the formation of the LDD structure in the drain layer 108, however, since this formation generally passes the step of simultaneously forming the insulating side walls 105 one each on the opposite sides of the gate electrode 101, this step inevitably imparts the layer 104 having an impurity diffused at a low concentration additionally to the terminal part of the source layer 107.

The low-concentration impurity diffused layer 104 in the source layer 107, therefore, forms a cause for increasing the parasitic capacity and parasitic resistance of the MOS transistor and inevitably degrades the quality of the transistor. In summary, in the conventional MOS transistor which adopts the LDD structure has not easily reconciled the repression of an increase in electric field and the improvement of the quality of transistor.

SUMMARY OF THE INVENTION

This invention has for an object thereof the provision of a semiconductor device possessed of a MOS transistor capable of lowering the parasitic capacity and parasitic resistance, promoting the addition to the speed of operation, and easily permitting miniaturization and a method for the production of a semiconductor device which represses the decrease in thickness of an insulating film for separating adjacent elements during the removal of a mask after the formation of a gate electrode of a MOS transistor.

This invention comprises forming a mask pattern in an area of the semiconductor substrate enclosed with an insulating film for the separation of adjacent elements, forming a conducting film covering the mask pattern and the environs thereof, then anisotropically etching the conducting film in a practically perpendicular direction and allowing part of the conducting film to remain in the lateral part of the mask pattern, and utilizing the conducting film remaining in the lateral part as a gate electrode.

The width of the gate electrode can be easily controlled because the width of the gate electrode or the gate length is determined by the thickness of the conducting film. As a result, the MOS transistor is capable of miniaturization. The gate electrode which is formed by the method described above realizes a stable gate length of not more than 0.3 $\mu$m without recourse to the limit of exposure and, moreover, fits quantity production and improves the reliability of the production.

Since the mask pattern is formed of a material different from that of the insulating film for the separation of adjacent elements, it becomes easy to etch the mask pattern selectively and repress the amount of the element-separating insulating film to be removed by etching and preclude the shrinkage of the element-separating insulating film.

Since the low-concentration impurity introduced layer is formed in the area of the semiconductor substrate which is not covered by the mask pattern and the gate electrode before the mask pattern is removed, then the insulating side wall is formed on one of the lateral parts of the gate electrode, and further the high-concentration impurity introduced layer is formed in the area of the semiconductor substrate not covered by the gate electrode and the insulating side wall by introducing the impurity into the semiconductor substrate while utilizing the gate electrode and the insulating side wall as masks, the impurity introduced drain layer on one of the lateral sides of the gate electrode assumes an LDD structure and the impurity introduced source layer on the other lateral side assumes a single structure.

When the low-concentration impurity introduced area is omitted from the terminal part of the source layer nearer to the gate electrode as described above, the distance between the source and the drain is decreased so much as to contribute to the addition to the scale of integration of the semiconductor element and, moreover, the parasitic resistance between the source and the drain is decreased, the surface area of the source layer is reduced and the parasitic capacity for the source is decreased and the transistor characteristic is improved. Since the drain layer assumes the LDD structure, the occurrence of hot carrier at the drain terminal is repressed. Since the low-concentration impurity introduced area in the drain layer of the LDS structure can be elongated in proportion as the low-concentration impurity introduced area of the source layer to be omitted is increased, the concentration of electric field in the drain layer is further allayed.

DESCRIPTION OF THE PREFERRED EMBODIMENTS

Now, the preferred embodiments of this invention will be described below with reference to the accompanying drawings.

(First Embodiment)

FIG. 1A–FIG. 1E are cross sections illustrating a process for the production of a semiconductor device according to the first embodiment of this invention.

Figure 1A:
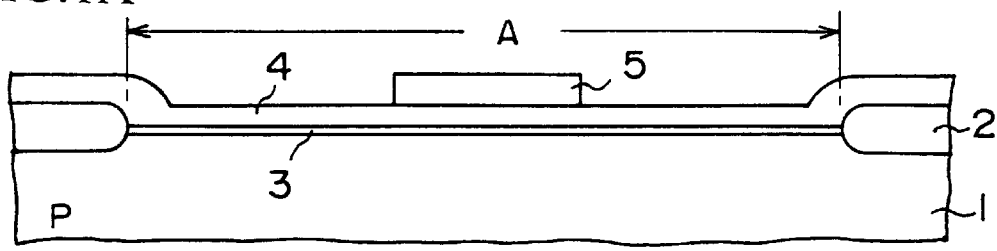
FIG. 1A–FIG. 1E are cross sections illustrating a process for the production of a semiconductor device according to the first embodiment of this invention.

First, the part of the process reaching the state which is illustrated in FIG. 1A will be described.

By thermally oxidizing by the LOCOS method the main face of a silicon substrate (semiconductor substrate) 1 containing such a p type impurity as boron and exhibiting resistance of 10 $\Omega$·cm, a field oxide film (element-separating insulating film) 2, 350 nm in thickness, is formed at a position enclosing an active element area A. This main face is assumed to be a (100) face of the silicon substrate 1.

Thereafter, the surface of the active element area A of the silicon substrate 1 is thermally oxidized to grow a protective film 3 of $SiO_2$, 10 nm in thickness, thereon. Subsequently, a masking film 4 is grown in a thickness of 100 nm by the CVD method on the protective film 3 and the field oxide film 2. The present invention imposes no particular restriction on the masking film 4 in this case except for the requirement that it be a material capable of preventing the silicon substrate 1 from being oxidized and, at the same time, different from the material of the field oxide film 1 and that of a conductive film (7) to be described herein below. Specifically, it is an insulating film of a substance other than $SiO_2$ or a metal film. The present embodiment presumes a case of using silicon nitride ($Si_3N_4$) for the masking film 4.

Next, a resist is applied to the surface of the masking film 4, exposed, and developed to form a first resist pattern 5 of the shape of a ribbon traversing the active element area A in the practically central part thereof and riding on the field oxide film 2.

Subsequently, the part of the masking film 4 which is not covered by the first resist pattern 5 is removed by the etching treatment using phosphoric acid. As a result, the masking film 4 is transformed into the shape of a ribbon, 0.5 $\mu$m in width and 5–6 $\mu$m in length, passing the center of the active element area A of the silicon substrate 1.

Figure 2A:
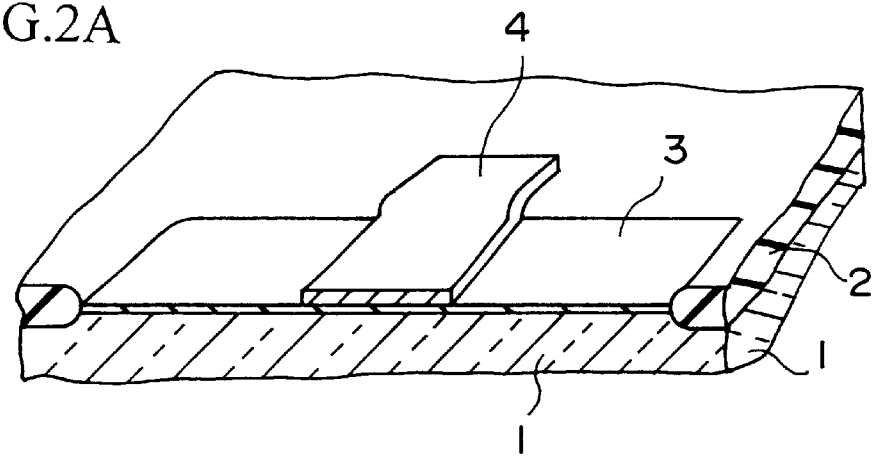
FIG. 2A–FIG. 2C are perspective views illustrating the process of production of the semiconductor device according to the first embodiment of this invention.

The masking film 4 which remains after the removal of the first resist pattern 5 assumes a state such that the terminal parts thereof ride on the field oxide film 2 as illustrated in the perspective view of FIG. 2A. The masking film 4 which has undergone the patterning treatment mentioned above will be referred to hereinafter as "mask pattern."

Figure 1B:
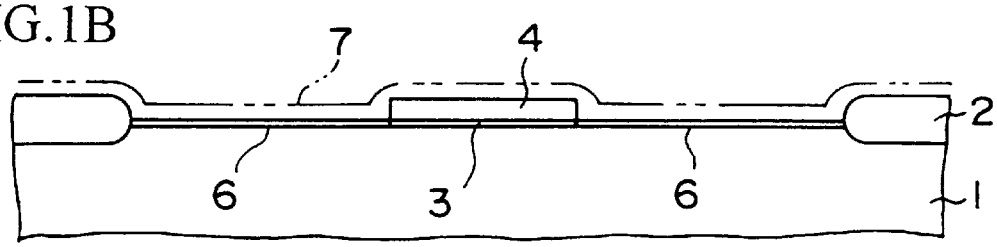

Next, the part of the protective film 3 which is not covered by the mask pattern 4 is removed by the use of diluted hydrofluoric acid. Subsequently, the surface of the part of the silicon substrate 1 which is not covered by the mask pattern 4 is again thermally oxidized to form a gate oxide film of $SiO_2$ (gate insulating film), 6, 5 nm in thickness, as illustrated in FIG. 1B.

Further, a polycrystalline silicon film 7 covering the mask pattern 4, the gate oxide film 6, and the field oxide film 2 is formed by the CVD method in a thickness of 100 nm. Subsequently, the polycrystalline silicon film 7 is converted into a conductive film by ion injecting phosphorus into the polycrystalline silicon film 7 under the conditions of 40 keV of acceleration energy and $4 \times 10^{15}$ atoms/cm$^2$ of dosage.

Next, a second resist pattern (not shown) is formed on the field oxide film 2 at the position above the area adjoining the master pattern 4 so that the second resist pattern may partially cover the polycrystalline silicon film 7. The details of the second resist pattern will be described in the third embodiment.

Figure 1C:
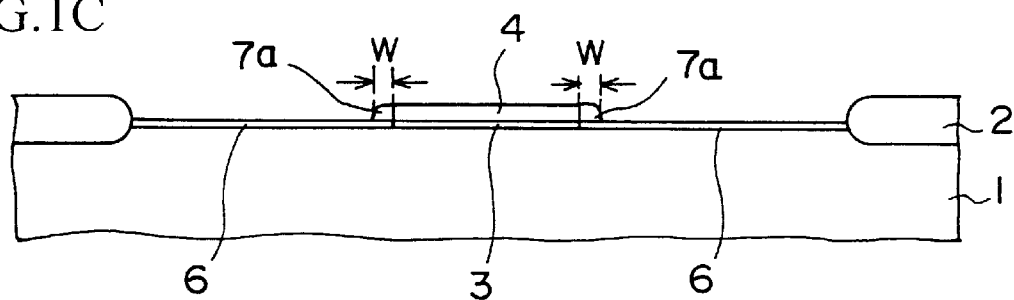
Figure 1D:
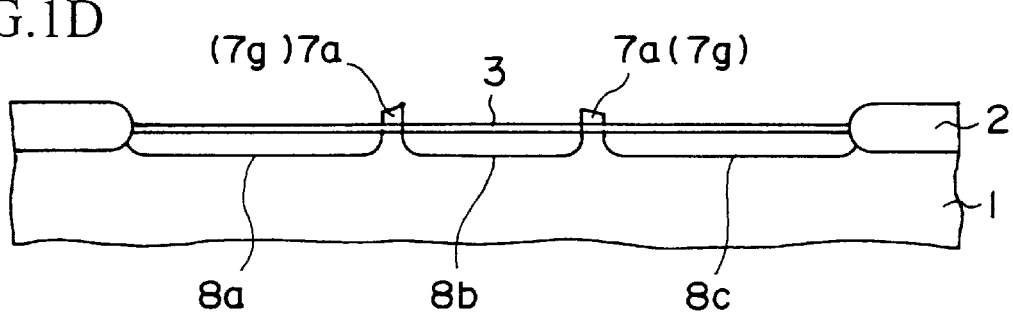

Thereafter, the polycrystalline silicon film 7 is anisotropically etched in a practically perpendicular direction by the reactive ion etching technique (RIE) using an etching gas composed of boron trichloride ($BCl_3$) and hydrochloric acid ($Cl_2$), with the result that the polycrystalline silicon film 7 will remain on the peripheral lateral face of the mask pattern 4 and under the second resist pattern as illustrated in FIG. 1C.

Figure 2B:
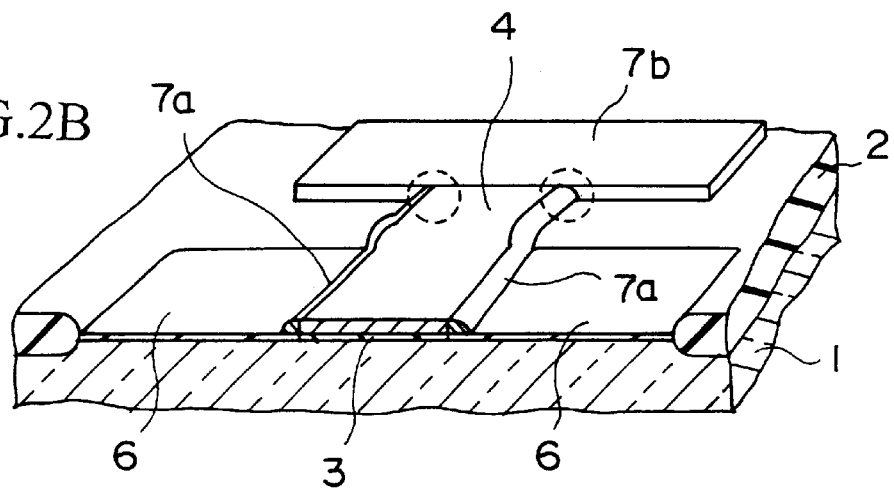

The polycrystalline silicon film 7 which remains on the lateral face of the mask pattern 4 will be hereinafter referred to as "conductive side wall." The width W of the bottom face of this conductive side wall is fixed substantially self-matchingly by the thickness of the polycrystalline silicon film 7 and it is about 100 nm, a value substantially equal to the thickness of the polycrystalline silicon film 7 on the master pattern 4. The polycrystalline silicon film 7 beneath the second resist pattern deposited under the conditions mentioned above is destined to be connected to a conducting side wall 7a. The polycrystalline silicon film 7 beneath the second resist pattern is utilized as a wire contact pad 7b which is connected to the conductive side wall 7a as illustrated in FIG. 2B.

After the polycrystalline silicon film 7 has been patterned as described above, the state illustrated in FIG. 1D is attained by selectively removing the mask pattern 4 by a wet etching treatment using phosphoric acid. The conductive side wall 7a which remains in the active element area A is utilized as a gate electrode 7g of the MOS transistor and the upper face of the gate electrode 7g is ultimately inclined. The gate length of the gate electrode 7g is about 100 nm, a value equaling the width W of the bottom face of the gate electrode 7g. Thus, the gate electrode 7g assumes a very minute stable shape.

Figure 2C:
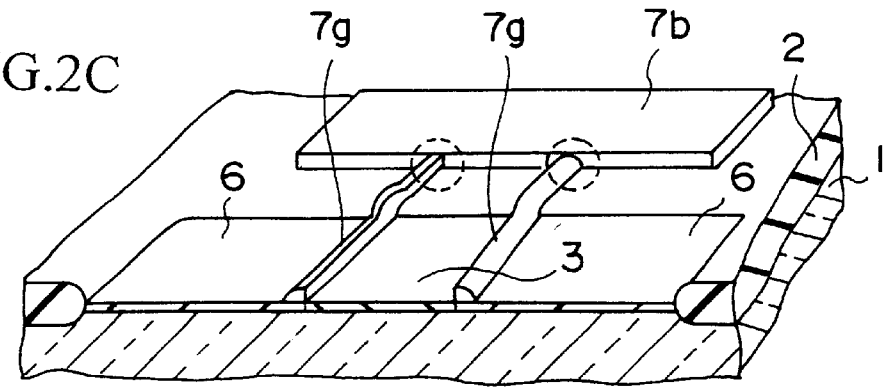

The perspective view of the state which ensues is as shown in FIG. 2C. The terminals of the two gate electrodes 7g on one side thereof are connected to one and the same wire contact pad 7b and the terminals thereof on the other side may be separated from each other or may be interjoined like a loop.

Incidentally, the protective film 3 is exposed in the area from which the mask pattern 4 has been removed. After this protective film 4 is removed, the newly exposed face may be again thermally oxidized to form a silicon oxide film.

Next, impurity introduced areas 8a–8c are formed one each in the three areas divided by the two gate electrodes 7g by ion injecting an n type impurity in the silicon substrate 1 in the active element area A while using the gate electrodes 7g and the field oxide film 2 as masks. Arsenic or phosphorus is available as the n type impurity. When arsenic is used as the n type impurity, for example, the conditions for the ion injection are 10 keV of acceleration energy and $1.0 \times 10^{15}$ atoms/cm$^2$ of dosage. The angle of ion injection in this case is 90°, namely the perpendicularity, relative to the (100) face of the silicon substrate 1. The reason for this angle is that the injection of the impurity into the area directly below the gate electrode 7a must be prevented to the fullest possible extent.

Subsequently to the ion injection, the impurity introduced areas 8a–8c are activated by applying a heat pulse to the impurity introduced areas 8a–8c in an atmosphere of nitrogen, at a temperature of 1000° C. for two seconds. When one of the impurity introduced areas 8b intervening between the two gate electrodes 7g is selected as a source layer, the two outside impurity introduced areas 8a and 8c function as drain layers. Conversely, when the impurity introduced area 8b intervening between the two gate electrodes 7g is selected as a source layer, the two outside impurity introduced areas 8a and 8c function as drain layers.

Figure 1E:
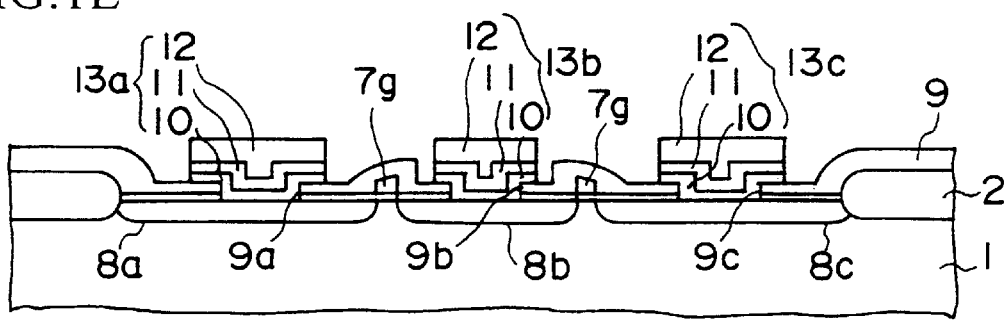

Next, an interlayer insulating film 9 of $SiO_2$ is formed on the entire face by the plasma CVD method as illustrated in FIG. 1E. Subsequently, contact holes 9a–9c are formed one each on the three impurity introduced areas 8a–8c by patterning the interlayer insulating film 9.

Next, a titanium (Ti) layer 10, 20 nm in thickness, is formed on the interlayer insulating film 9 and in the contact holes 9a–9c by the sputtering method. Subsequently, a titanium nitride (TiN) layer 11, 100 nm in thickness, and a blanket 12 of tungsten, 150 nm in thickness, are sequentially formed on the Ti layer 10 by the sputtering method.

Further, three outgoing electrodes 13a–13c severally connected to the three impurity introduced areas 8a–8c are formed by patterning the Ti layer 10, the TiN layer 11, and the blanket 12 by the photolithographic technique. When the central impurity introduced area 8b is selected as a source, the outgoing electrode 13b superposed thereon functions as a source electrode. When the two outer impurity introduced areas 8a and 8c are selected as drains, the two outgoing electrodes 13a and 13c superposed thereon function as drain electrodes.

The preceding description has depicted a case of using an impurity-containing polycrystalline silicon as the material for the gate electrode 7. This material may be a semiconductor containing an impurity or a metal such as gold, tungsten, or titanium instead. When a metal is adopted as the material, the trouble of doping the formed film with an impurity can be omitted.

The gate of the MOS transistor which is formed through the series of steps described above assumes the so-called dual gate structure possessed of two gate electrodes 7g in the active element area A and has an effective gate length of 0.2 μm.

Since the gate electrodes 7g are formed of the portions of the conductive side walls 7a which are left on the lateral parts of the mask pattern 4 by anisotropically etching the conductive film, the gate length W of the gate electrodes 7g can be easily controlled by controlling the thickness of the conductive film. Thus, the gate electrodes 7g can be formed in a width not exceeding 0.1 μm and possibly decreasing to the neighborhood of 70 nm or 50 nm, for example. As a result, the LSI using this MOS transistor is enabled to acquire an improved scale of integration and decrease the parasitic resistance by shortening the distance between the source and the drain.

The description given above represents a case of forming the mask pattern 4 with a material different from the material of the field oxide film 2. In the removal of the mask pattern 4, therefore, the decrease and contraction of the field oxide film 2 can be prevented.

(Second Embodiment)

This embodiment concerns a process for the production of a MOS transistor possessed of a LDD structure and a source layer omitting an LD layer.

First, the mask pattern 4 in the form of a stripe is formed in the active element area A through the steps shown in FIG. 1A–FIG. 1C. Then, the conductive side walls 7a are formed on the opposite sides thereof and these side walls 7a are used as gate electrodes 7g of the MOS transistor. At the same time that the side walls 7a are formed, the wire contact pads are formed on the field oxide film 2. Since the steps mentioned thus far are identical to those of the first embodiment, their details will be omitted from the following description.

Figure 3A:
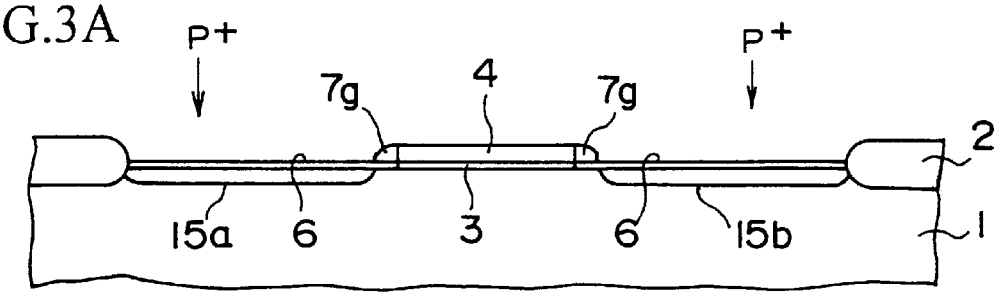
FIG. 3A–FIG. 3D are cross sections illustrating a process for the production of a semiconductor device according to the second embodiment of this invention.

Next, phosphorus is ion injected into the active element area A of the silicon substrate 1, with the gate electrode 7g and the mask pattern 4 used as masks for intercepting the ions being injected as illustrated in FIG. 3A. The injection of phosphorus ions is effected under the conditions of 20 keV of acceleration energy and $1\times10^{13}$ atoms/cm$^2$ of dosage. The phosphorus ions are injected into the silicon substrate in four directions each inclined by an angle of several degrees from the direction perpendicular to the main face of the substrate.

Figure 4A:
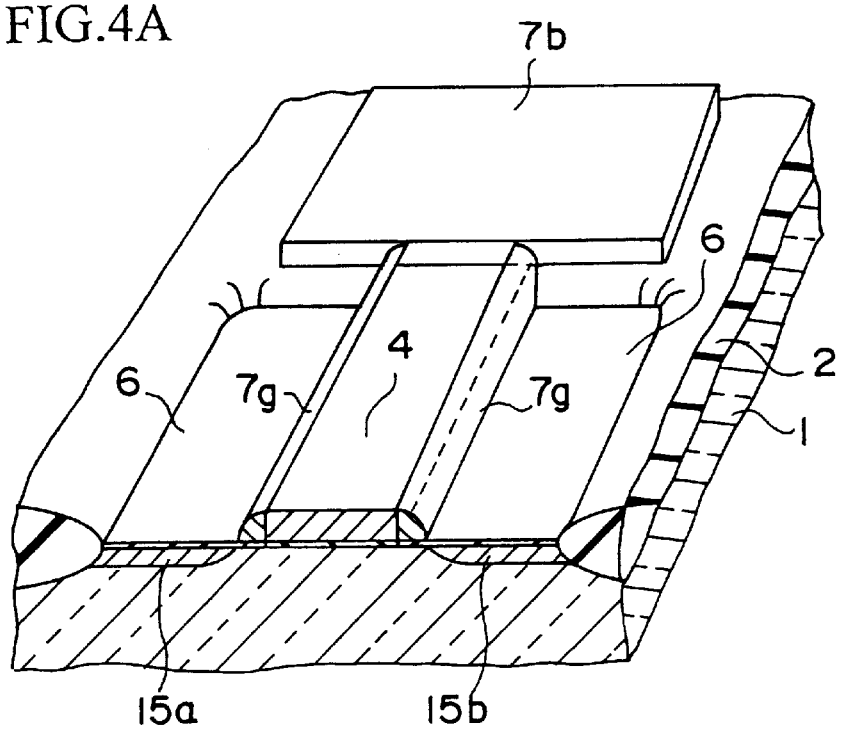
FIG. 4A and FIG. 4B are perspective views illustrating the process for the production of the semiconductor device according to the second embodiment of this invention.

As a result, first and second low-concentration impurity introduced areas 15a and 15b are formed in the areas of the silicon substrate 1 falling on the sides of the two gate electrodes 7g which do not adjoin the mask pattern 4. The perspective view of the ensuing state is as shown in FIG. 4A.

Figure 3B:
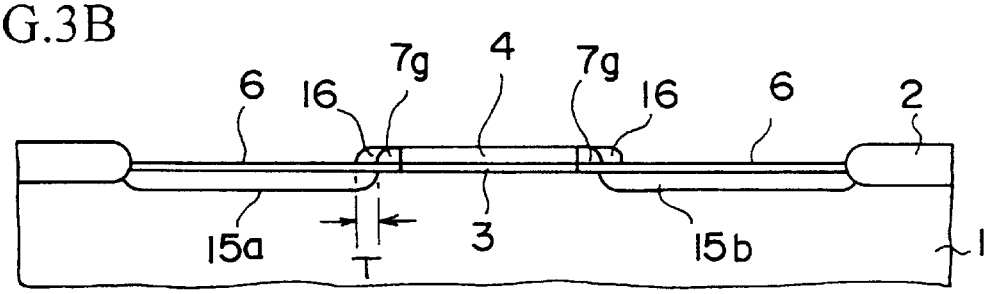

Thereafter, a SiO$_2$ film is formed in a thickness of 40 nm on the entire face by the CVD method. This SiO$_2$ film is etched in the perpendicular direction by the RIE method, with the result that the SiO$_2$ film remains only on the lateral faces of the two gate electrodes 7g which are present respectively on the first and second low-concentration impurity introduced areas 15a and 15b. The portions of the SiO$_2$ film which remain on one side of the two gate electrodes 7g as illustrated in FIG. 3B will be referred to hereinafter as "insulating side walls 16." The width T of the insulating side walls 16 is nearly equal to the thickness of the SiO$_2$ film.

Next, the mask pattern 4 is removed by the use of an aqueous phosphoric acid solution to expose the protective film 3 between the two gate electrodes 7g.

Figure 3C:
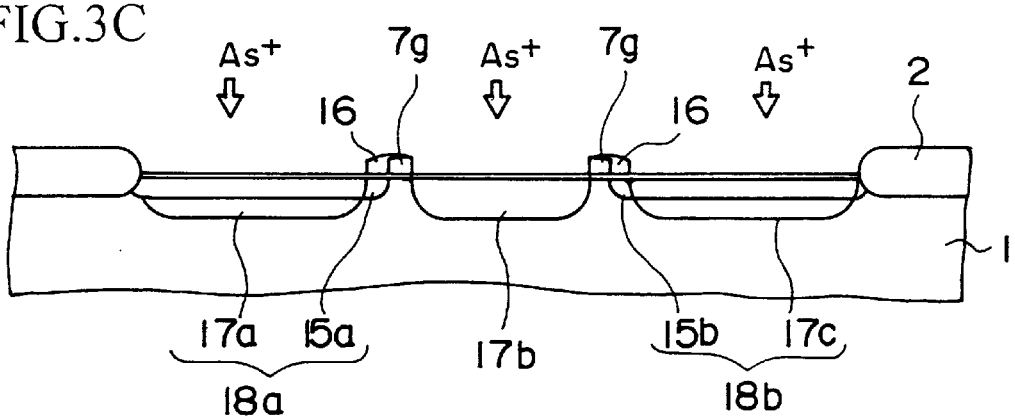

A first, a second, and a third high-concentration impurity introduced areas 17a–17c are formed by ion injecting arsenic into the parts of the silicon substrate 1 falling on the opposite sides of each of the two gate electrodes 7g while using the insulating side walls 16 and the gate electrodes 7g as masks as illustrated in FIG. 3C. The injection of arsenic ions is effected under the conditions of 10 keV of acceleration energy and $1\times10^{15}$ atoms/cm$^2$ of dosage. The arsenic ions are injected perpendicularly to the face of the substrate.

As a result, the first and second low-concentration impurity introduced areas 15a and 15b which exist on the lateral sides of the gate electrodes 7g respectively overlie the first and third high-concentration impurity introduced areas 17a and 17c and constitute themselves a first and second drain layers 18a and 18b. Besides, between the two gate electrodes 7g in the active element area A, a single-structure source layer is formed solely of the second high-concentration impurity introduced area 17b from which the LD (lightly doped) area is absent.

Thereafter, the silicon substrate 1 is placed in an atmosphere of nitrogen and pulse heated therein at a temperature of 1000° C. for two seconds to activate the first and second low-concentration impurity introduced areas 15a and 15b and the first through third high-concentration impurity introduced areas 17a–17c.

Figure 4B:
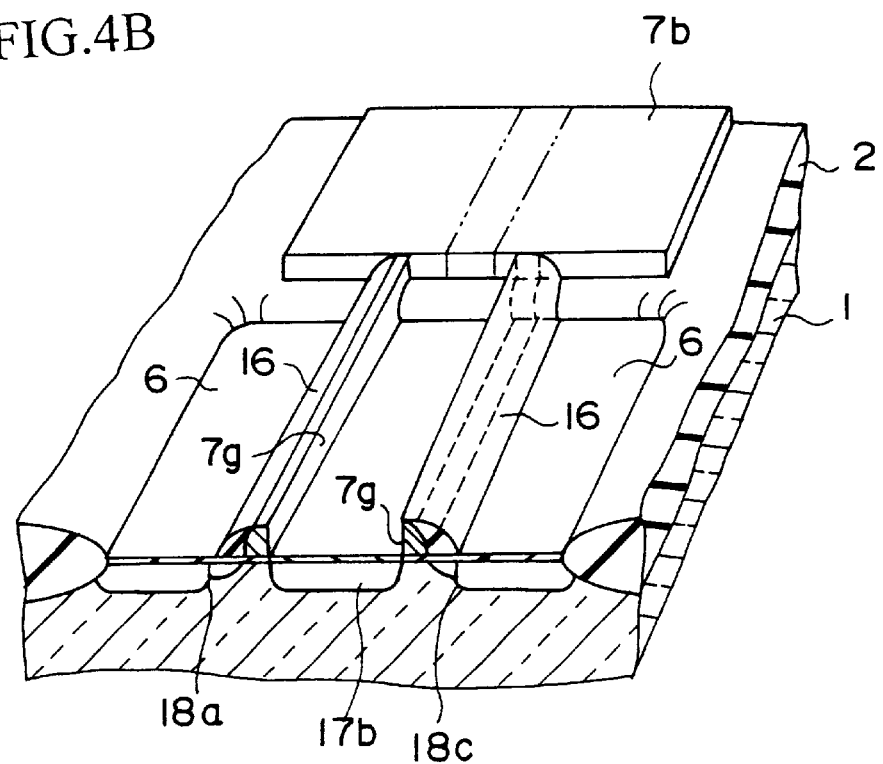

The perspective view of the element forming area A and the vicinity thereof in the activated silicon substrate 1 is as shown in FIG. 4B.

Next, the interlayer insulating film 9 of SiO$_2$ is formed on the entire face by the plasma CVD method. Subsequently, the interlayer insulating film 9 is patterned to form the contact holes 9a–9c respectively on the source layers 17b and the drain layers 18a and 18b. Further, similarly to the first embodiment, the source electrodes 13b passing the contact hole 9b on the source layer 17b is formed and the drain electrodes 13a and 13c passing the contact holes 9a and 9c on the drain layers 18a and 18b are formed.

Incidentally, by the process described above, the control of the gate length of the gate electrodes 7g can be controlled easily similarly to the first embodiment. Further, in accordance with the process of production mentioned above, it is easy to confer the LDD structure only on the drain layers 18a and 18b on one side of the gate electrodes 7g and the single structure on the source layer 17b on the other side. Moreover, it is easy to decrease the gate electrodes 7g to or below 0.1 μm.

As a result, the MOS transistor to be formed by the process described above attains miniaturization in consequence of the contraction of the gate width of the gate electrodes 7g. Then, the inclination of the electric field of the drain layers 18a and 18b and the vicinities thereof is moderated by the LDD structure and the occurrence of a hot carrier is repressed. Since the source layer 17b is not possessed of an LDD structure, the rise of the resistance in the channel area between the source layer 17b and the drain layers 18a and 18b is restrained and, further, the area of the source layer 17b is reduced and the parasitic capacity is decreased. Consequently, the decline of the ON current is curbed and the degradation of the circuit quality of transistor is prevented in spite of the contraction of elements.

Incidentally, since the mask pattern 4 is formed of a material different from that for the field oxide film 2, the decrease and contraction of the field oxide film 2 can be precluded during the removal of the mask pattern 4. Moreover, since the mask pattern 4 is formed of a material different from that for the insulating side wall 16, the extinction of the insulating side wall 16 cannot occur during the removal of the mask pattern 4.

As the material for the insulating side wall 16, SiON may be used besides $SiO_2$. On the basis of the etching rate of a $Si_3N_4$ film with phosphoric acid taken as unity (1), the etching rate of a SiON film with phosphoric acid may be 1/10 and the etching rate of a $SiO_2$ film may be less than 1/100. On the basis of the etching rate of a $SiO_2$ film with hydrofluoric acid taken as unity, the etching rate of a SiON film with hydrofluoric acid may be 1/10 and the etching rate of a $Si_3N_4$ film may be less than 1/100.

Optionally, a plurality of low-concentration impurity introduced areas differing in concentration may be disposed on the lateral part of one of the insulating side walls 16 by additionally forming a different insulating side wall.

(Third Embodiment)

The formation of a wire contact pad connected to two gate electrodes 7g on the field oxide film 2 in the preceding first and second embodiments will be described below.

As the first example, the process for the formation of the wire contact pad 7b illustrated in FIG. 2B will be described.

Figure 5:
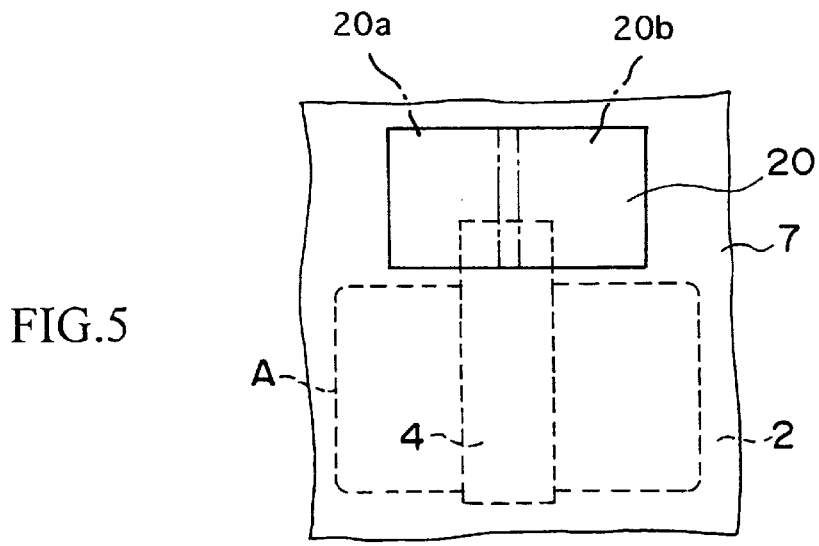
FIG. 5 is a plan view illustrating the layout of a resist pattern for the formation of a first wire contact pad in the third embodiment of this invention.
Figure 6A:
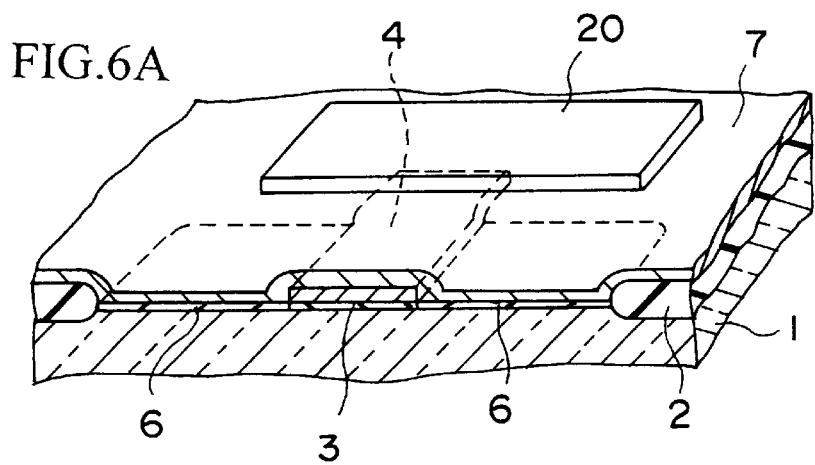
FIG. 6A and FIG. 6B are perspective views illustrating a process for the formation of the first wire contact pad in the third embodiment of this invention.

First, after the mask pattern 4 has been covered with the polycrystalline silicon film 7 as described in the first embodiment, a second resist pattern 20 is formed at a position such that it partly overlaps the mask pattern 4 on the field oxide film 2 as illustrated in FIG. 5 and FIG. 6A. FIG. 5 is a plan view of the second resist pattern 20 and the mask pattern 4 as seen from above and FIG. 6A is a perspective cross section of the components.

In this case, when the mask pattern 4 and the second resist pattern 20 are designed in advance such that the overlap occurs in a size of not less than 1.0 $\mu$m in the longitudinal direction of the mask pattern 4 in the form of a stripe, the second resist pattern 20 does not completely separate from the mask pattern 4 even when the second resist pattern 20 produces an ordinary dislocation.

Figure 6B:
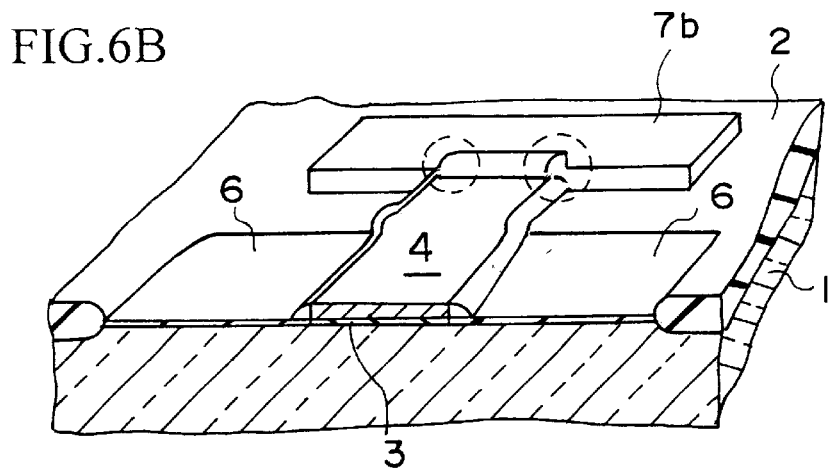

Next, when the second resist pattern 20 is removed after the polycrystalline silicon film 7 has been anisotropically etched with the second resist pattern 20 as a mask, the polycrystalline silicon film 7 which remains beneath the second resist pattern 20 assumes such a rectangular shape as illustrated in FIG. 6B. This rectangular polycrystalline silicon film 7 constitutes itself the wire contact pad 7b as described in the preceding embodiment. The wire contact pad 7b forms a protuberance in the part at which it overlaps the gate electrode 7g as enclosed with a broken line in FIG. 6B. This protuberance arises from the superposition of the second resist pattern 20 on the wire contact pad 7b and ensures the connection of the second resist pattern 20 with the wire contact pad.

The superposition of the second resist pattern 20 on the terminal part of the mask pattern 4 attained as described above proves advantageous. Any dislocation of the second resist pattern 20 which is suffered to occur to such an extent as shown below is tolerable.

Figure 7:
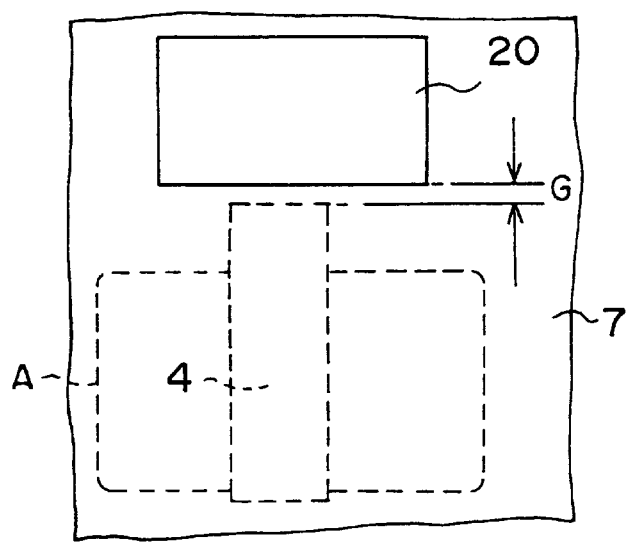
FIG. 7 is a plan view illustrating the layout of a resist pattern for the formation of a second wire contact pad in the third embodiment of this invention.
Figure 8A:
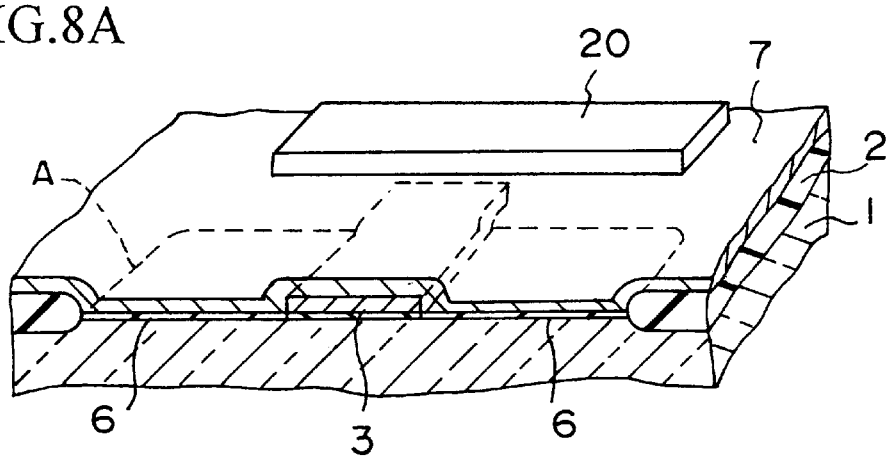
FIG. 8A and FIG. 8B are perspective views illustrating a process for the formation of the second contact pad.

When the second resist pattern 20 and the mask pattern 4 are separated by a gap G which is smaller than the thickness of the polycrystalline silicon film 7 as illustrated in the plan view of FIG. 7 and the perspective view of FIG. 8A, the connection is secured if nominally at least between the wire contact pad 7b and the gate electrodes 7g.

Figure 8B:
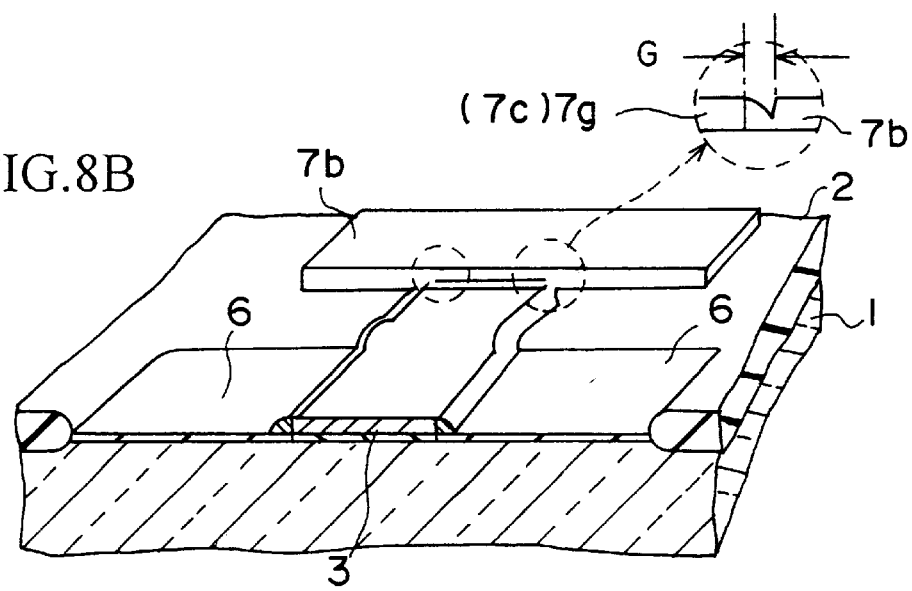

To be specific, since the polycrystalline silicon film 7 is etched in the perpendicular direction as illustrated in FIG. 8B, the portions of the polycrystalline silicon film 7 that remain on the opposite lateral parts of the mask pattern 4, namely the conductive side walls 7a, also remain between the wire contact pad 7b and the second resist pattern 20 and they establish the connection between the gate electrodes 7g and the wire contact pad 7b.

Figure 3D:
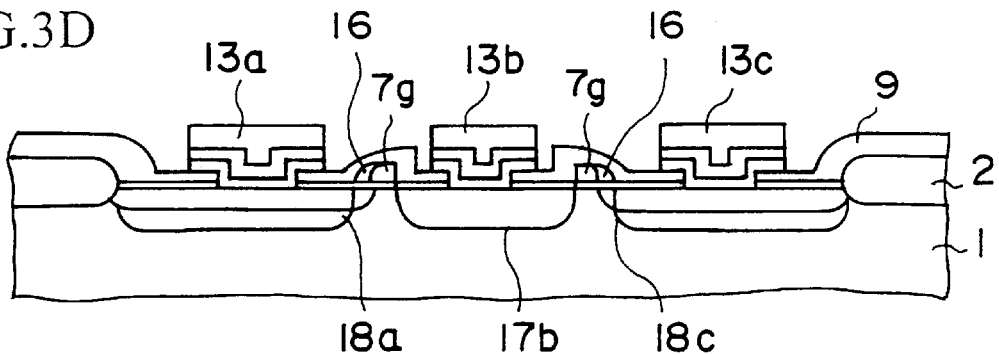
Figure 9:
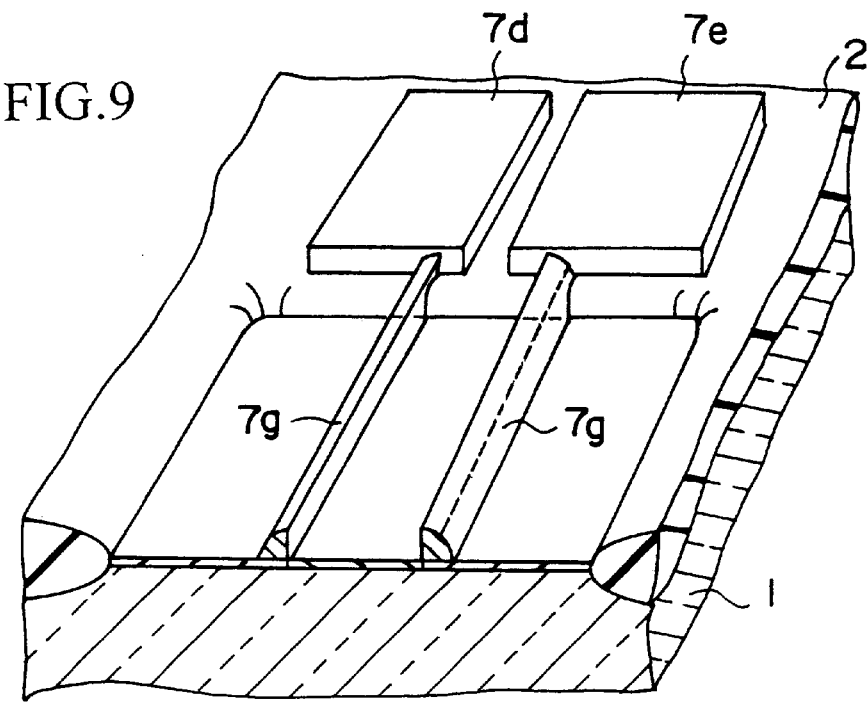
FIG. 9 is a perspective view illustrating a third contact pad in the third embodiment of this invention.

Incidentally, there may be adopted a structure such that two divided wire contact pads 7d and 7e are formed and they are severally connected to two gate electrodes 7g as illustrated in FIG. 9. In this case, two MOS transistors are in a state such that they are parallelly connected by sharing one impurity introduced area 8b or 17b as illustrated in FIG. 1E and FIG. 3D. To form these two wire contact pads 7d and 7e, it is necessary to divide the resist pattern 20 in advance along the part indicated by an alternate dot and dash line into two halves as illustrated in FIG. 5 and obtain first and second resist patterns 20a and 20b.

Figure 10A:
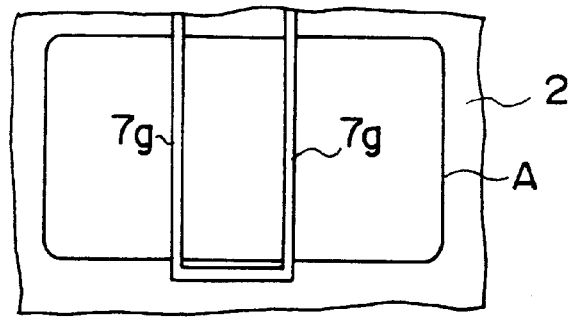
FIG. 10A and FIG. 10B are plan vies illustrating the end part of a gate electrode not connected to the contact pad in the third embodiment of this invention.
Figure 10B:
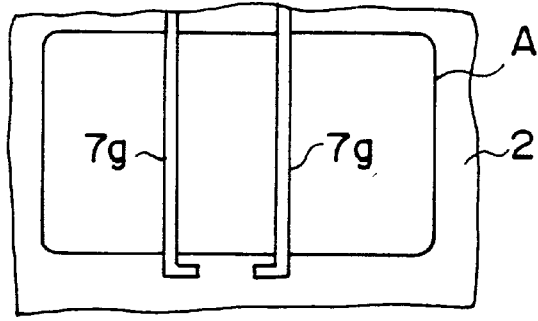

The gate electrodes 7g severally of the two MOS transistors in the active element area A in the state assumed immediately after the formation, however, are ultimately connected in the terminal parts thereof on the side opposite the wire contact pad 7a as illustrated in FIG. 10A. This structure is utilized for the dual gate structure as demonstrated in the first and the second embodiment. This is because the conductive side wall 7a is formed along the periphery of the mask pattern 4 in the shape of a ribbon. When the structure illustrated in FIG. 9 is adopted, therefore, those of the gate electrodes 7g which are not connected to the wire contact pads 7d and 74 are required to have the terminal parts thereof severed as illustrated in FIG. 10B.

When the structure having two gate electrodes in one MOS transistor, namely the dual gate structure, is to be adopted, the patterning for the separation of the gate electrodes may be present or absent.

Even in the case of the MOS transistor which has such an LDD structure as illustrated in FIG. 4B, the wire contact pad 7b may be divided into two halves along the part indicated by an alternate dot and dash line and they may be severally connected to the two gate electrodes 7g.

(Fourth Embodiment)

The preceding embodiments represent the cases of using in the formation of gate electrodes the mask pattern 4 of the form of a ribbon passing the center of the active element area A. Optionally, the mask pattern 4 may be in a form having an opening passing the center mentioned above.

Figure 11A:
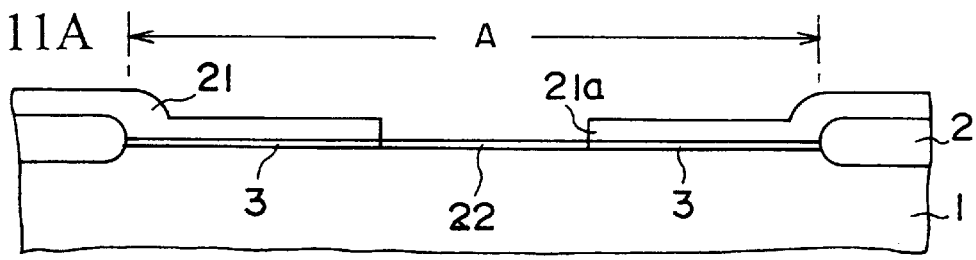
FIG. 11A–FIG. 11E are cross sections illustrating a process for the production of a semiconductor device according to the fourth embodiment of this invention.

For example, a mask pattern 21 is formed of silicon nitride such that it is possessed of an opening 21a in an area thereof passing the center of the active element area A as illustrated in FIG. 11A. This mask pattern 21 is required to assume a planar shape such that it exposes the field oxide film 2 in the area forming the wire contact pad on the field oxide film 2 and the vicinity thereof.

Thereafter, the protective film 3 is removed through the opening 21a and the area remaining after this removal is again thermally oxidized to form a gate oxide film (gate insulating film) 22.

Figure 11B:
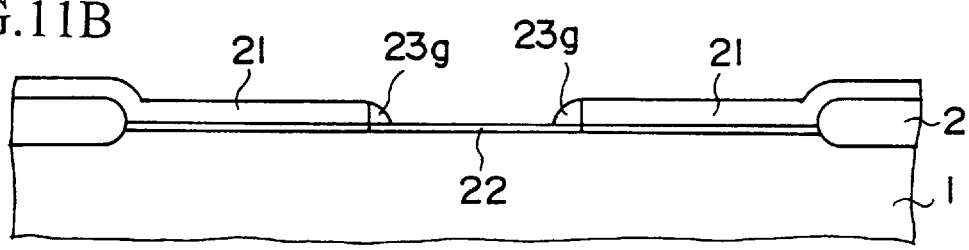
Figure 11C:
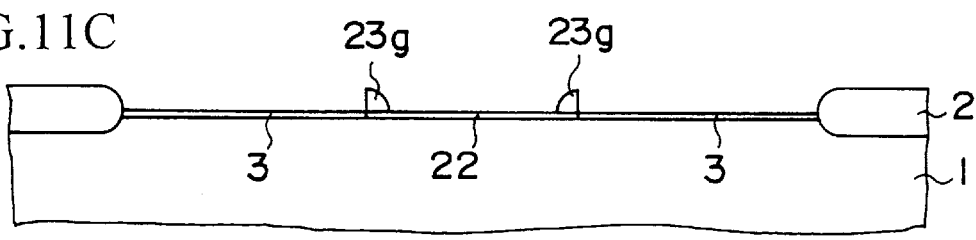
Figure 11D:
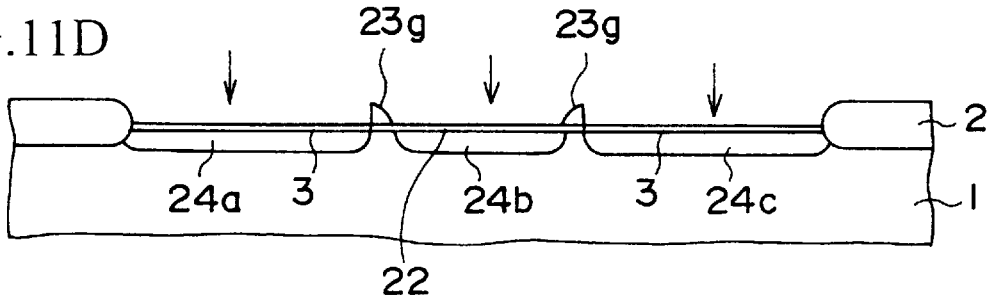

Next, a polycrystalline silicon film is formed on the entire face, an impurity is introduced into this polycrystalline silicon film, and the polycrystalline silicon film is anisotropically etched in the perpendicular direction by the RIE method. As a result, conductive side walls 23g are formed on the inner lateral faces of the opening 21a of the mask pattern 21 as illustrated in FIG. 11B. The side walls 23g are utilized as gate electrodes in the element forming area A. Subsequently, the mask pattern 21 is removed with an aqueous phosphoric acid solution.

Next, the impurity for the formation of source and drain are ion injected into the portions of the silicon substrate 1 falling on the opposite sides of the gate electrodes 23g to form impurity introduced areas 24a–24c as illustrated in FIG. 11. Then, the silicon substrate 1 is annealed in an atmosphere of nitrogen at a temperature in the neighborhood of 1000° C. for the purpose of restoring crystals and activating the impurity. The conditions for the ion injection are the same as those for the formation of the impurity introduced areas 8a–8c demonstrated in the first embodiment.

Figure 11E:
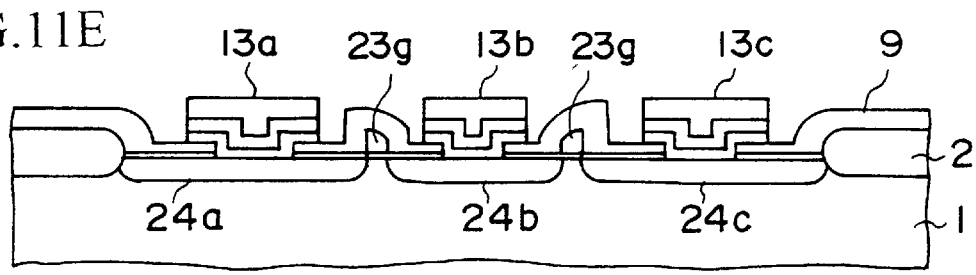
Figure 12A:
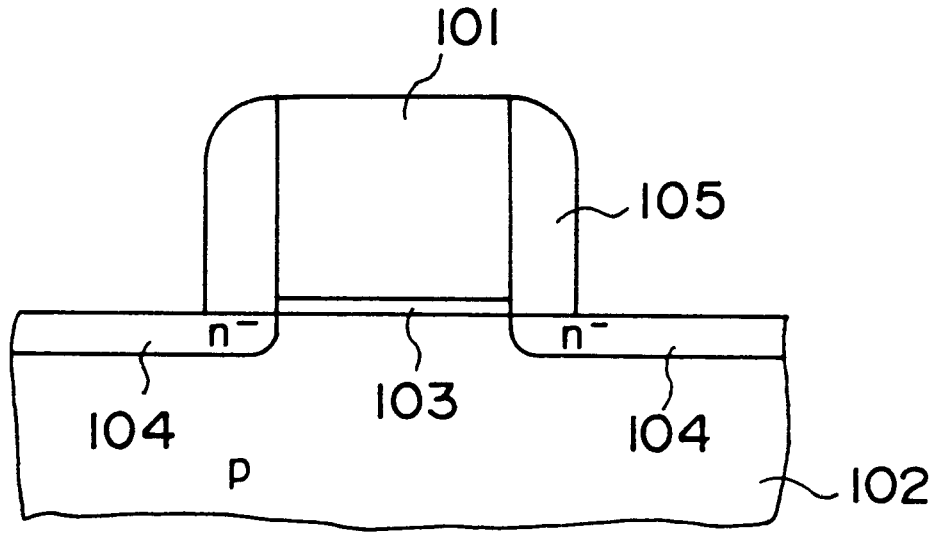
FIG. 12A and FIG. 12B are cross sections illustrating a process for the production of a conventional semiconductor device.
Figure 12B:
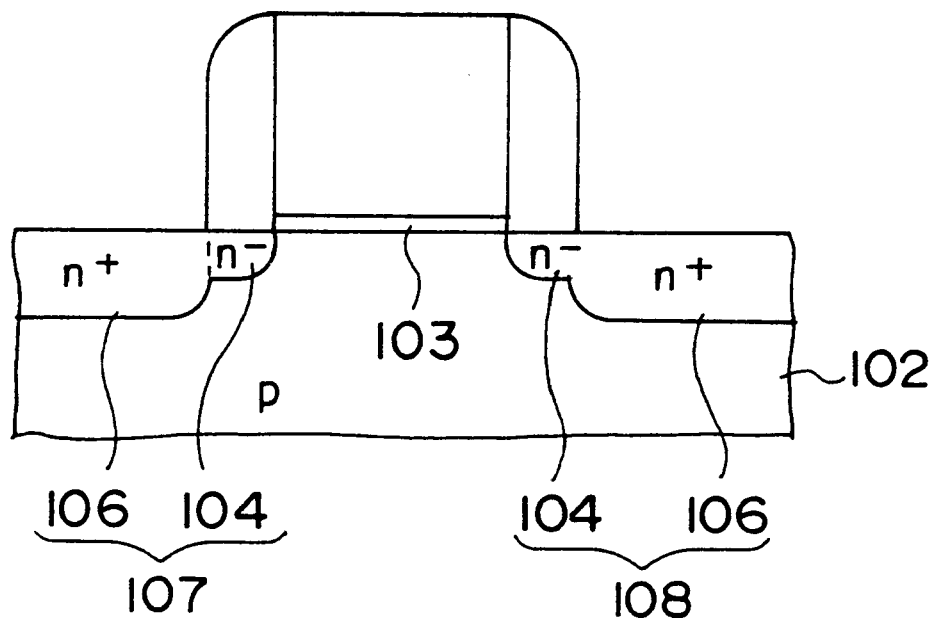

Further, the interlayer insulating film 9 is formed, contact holes are formed therein, and then the electrodes 13a–13c for connection to impurity introduced layers 24a–24c are formed through the contact holes as illustrated in FIG. 11E.

In FIG. 11A–FIG. 11E, like components found in FIG. 1 are denoted by like reference numerals. The wire contact pad is formed in the same manner as in the third embodiment. The gate electrodes 23g to be formed through the process described above can acquire a gate length equal to or less than 0.1 µm similarly to the first embodiment. Moreover, since the material for the mask pattern 21 is different from the materials for the field oxide film and the gate electrodes, the removal of the mask pattern is easily attained.

In accordance with this invention, the mask pattern is etched selectively, the amount of the element-separating insulating film to be lost by etching is easily repressed, and the element-separating insulating film is prevented from being contracted because the mask pattern is formed in the area of the semiconductor substrate enclosed with the element-separating insulating film, the conductive film is formed so as to cover the mask pattern and the vicinity thereof, the conductive film is anisotropically etched in the practically perpendicular direction so as to allow part thereof to remain in the lateral parts of the mask pattern, and the parts of the conductive film remaining in the lateral parts are utilized as gate electrodes as described above.

Further, the low-concentration impurity introduced areas are formed in the areas of the semiconductor substrate not covered by the mask pattern and the gate electrodes before the removal of the mask pattern, then the insulating side walls are formed on the lateral parts of one of the gate electrodes the impurity is introduced into the semiconductor substrate with the gate electrodes and the insulating side walls as masks to form the high-concentration impurity introduced layers in the areas of the semiconductor substrate not covered by the gate electrodes and the insulating side walls, and consequently the impurity introduced drain layer on one lateral part of the gate electrode constitutes an LDD structure and the impurity introduced source layer on the other lateral part constitutes a single structure. As a result, the distance between the source and the drain is reduced, the scale of integration of the semiconductor element is exalted, and the transistor property is improved in accordance as the amount of the low-concentration impurity introduced area of the source layer to be omitted is increased. Further, since the drain layer assumes the LDD structure, the occurrence of a hot carrier at the drain terminal is repressed.

What is claimed is:

1. A semiconductor device comprising:

a semiconductor substrate;

a first gate electrode formed on said semiconductor substrate via a gate insulating film which is substantially wider than the first gate electrode;

a second gate electrode formed on said semiconductor substrate apart from said first gate electrode via a gate insulating film which is substantially wider than the second gate electrode;

a first impurity introduced area of an LDD structure composed of a low-concentration impurity area and a high-concentration impurity area, the first impurity introduced area being formed on said semiconductor substrate on one side of said first gate electrode which is not opposed to said second gate electrode, and not extending underneath the first gate electrode;

a second impurity introduced area of an LDD structure composed of a low-concentration impurity area and a high-concentration impurity area, the second impurity introduced area being formed on said semiconductor substrate on one side of said second gate electrode which is not opposed to said first gate electrode, and not extending underneath the second gate electrode;

a third impurity introduced area composed solely of a high-concentration impurity area, the third impurity introduced area being formed on said semiconductor substrate in the area between said first and second gate electrodes, and not extending underneath the first and second gate electrodes; and said first and second gate electrodes being connected, at one end thereof extending in the gate width direction, to a wire contact pad formed on said semiconductor substrate via an element-separating insulating film, and being connected to each other at another end thereof.

2. A semiconductor device according to claim 1, wherein each of said first and second gate electrodes have a structure in which one side of a section seen along the gate length direction is perpendicular to said semiconductor substrate and the section is gradually increased in a direction from a topside toward a bottom side.

\* \* \* \* \*